United States Patent
Dargis et al.

(10) Patent No.: US 8,796,121 B1
(45) Date of Patent: Aug. 5, 2014

(54) STRESS MITIGATING AMORPHOUS $SIO_2$ INTERLAYER

(71) Applicants: Rytis Dargis, Fremont, CA (US);
Andrew Clark, Los Altos, CA (US);
Erdem Arkun, San Carlos, CA (US)

(72) Inventors: Rytis Dargis, Fremont, CA (US);
Andrew Clark, Los Altos, CA (US);
Erdem Arkun, San Carlos, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

(21) Appl. No.: 14/083,672

(22) Filed: Nov. 19, 2013

(51) Int. Cl.
*H01L 21/20* (2006.01)
*C30B 25/18* (2006.01)
*C30B 25/22* (2006.01)

(52) U.S. Cl.
USPC .......................................... 438/496; 117/105

(58) Field of Classification Search
CPC ................................................. H01L 21/02639
USPC .................................................. 438/481, 763
See application file for complete search history.

(56) References Cited

U.S. PATENT DOCUMENTS

| | | | | |
|---|---|---|---|---|
| 7,432,550 | B2 * | 10/2008 | Bojarczuk et al. | 257/347 |
| 8,394,194 | B1 * | 3/2013 | Dargis et al. | 117/4 |
| 2010/0038521 | A1 * | 2/2010 | Clark et al. | 250/208.6 |
| 2013/0334536 | A1 * | 12/2013 | Dargis et al. | 257/76 |

* cited by examiner

*Primary Examiner* — Olik Chaudhuri
*Assistant Examiner* — Christine Enad

(57) ABSTRACT

A method of forming a REO dielectric layer and a layer of a-Si between a III-N layer and a silicon substrate. The method includes depositing single crystal REO on the substrate. The single crystal REO has a lattice constant adjacent the substrate matching the lattice constant of the substrate and a lattice constant matching a selected III-N material adjacent an upper surface. A uniform layer of a-Si is formed on the REO. A second layer of REO is deposited on the layer of a-Si with the temperature required for epitaxial growth crystallizing the layer of a-Si and the crystallized silicon being transformed to amorphous silicon after transferring the lattice constant of the selected III-N material of the first layer of REO to the second layer of REO, and a single crystal layer of the selected III-N material deposited on the second layer of REO.

13 Claims, 4 Drawing Sheets

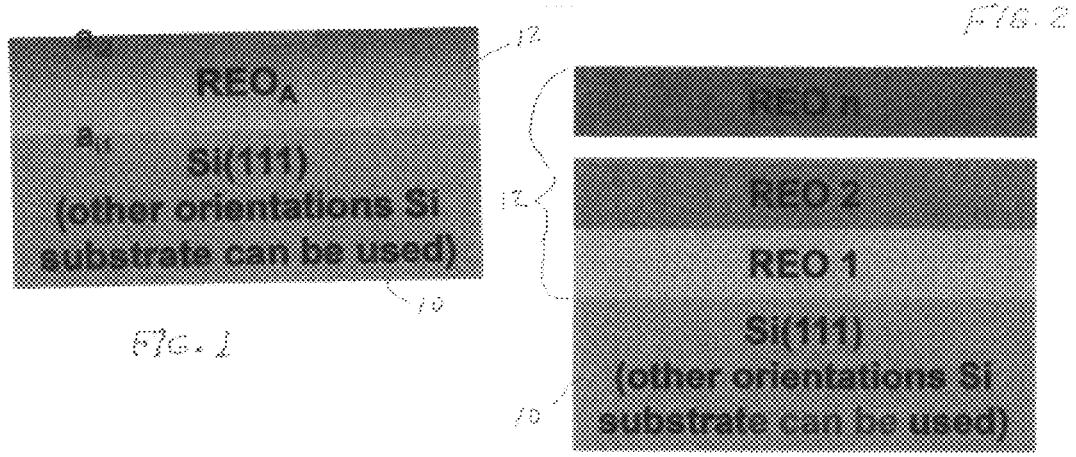
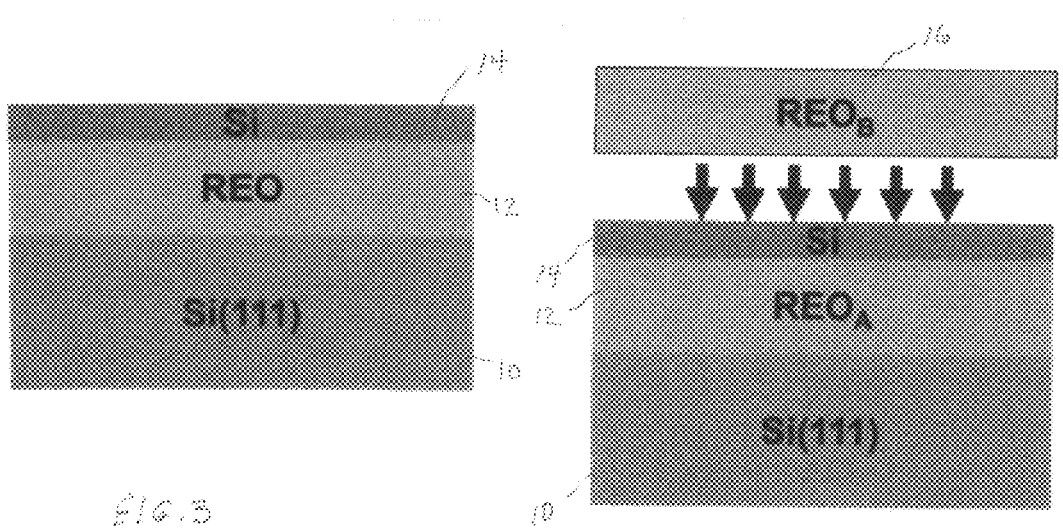

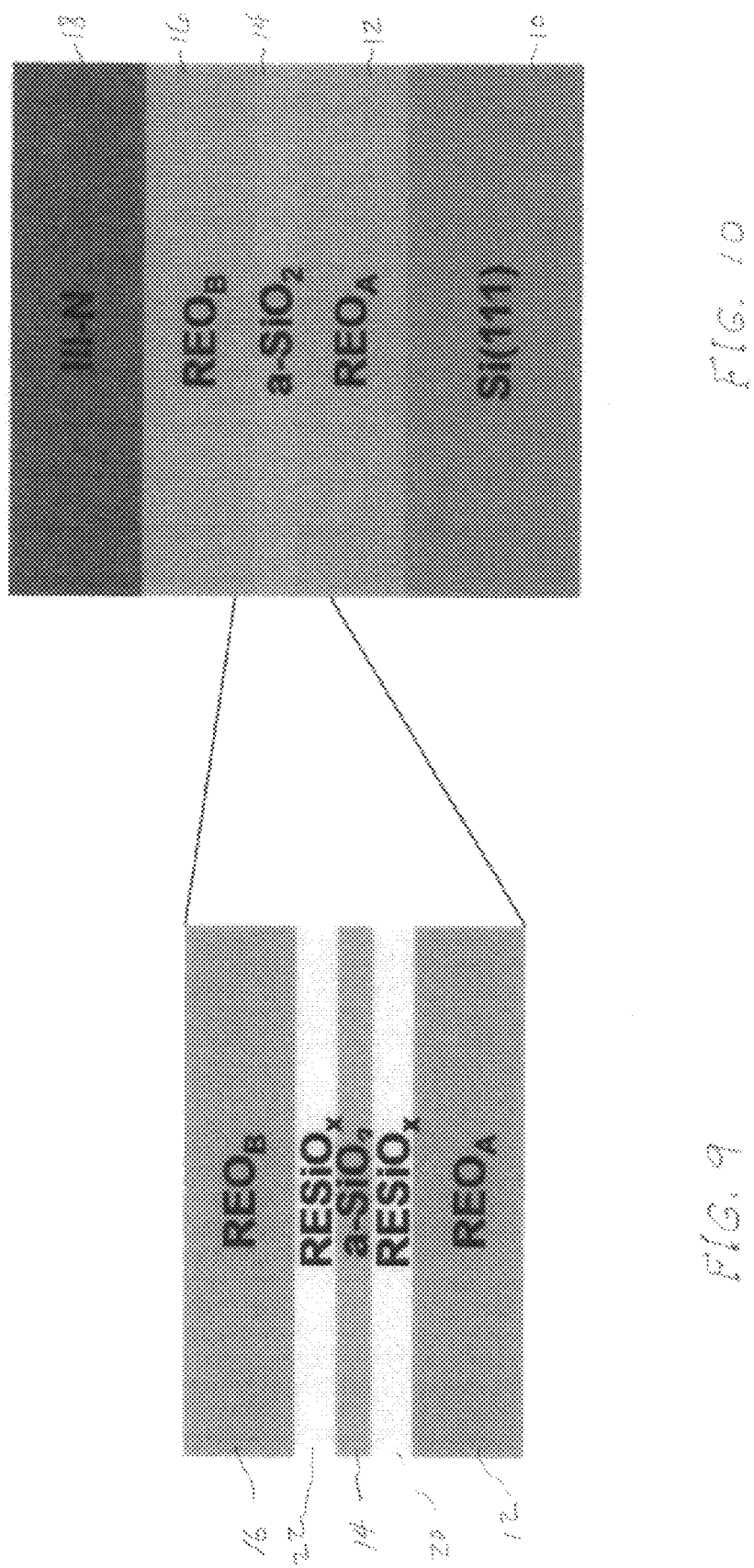

STRESS MITIGATING AMORPHOUS SIO₂ INTERLAYER

FIELD OF THE INVENTION

This invention relates in general to the formation of amorphous silicon oxide between single crystal rare earth oxide layers on a silicon wafer.

BACKGROUND OF THE INVENTION

It has been found that III-N materials are a desirable semiconductor material in many electronic and photonic applications. As understood in the art, the III-N semiconductor material must be provided as a crystalline or single-crystal formation for the most efficient and useful bases for the fabrication of various electronic and photonic devices therein. Further, the single-crystal III-N semiconductor material is most conveniently formed on single-crystal silicon wafers because of the extensive background and technology developed in the silicon semiconductor industry and because integration of electronic circuits is easier. However, the crystal lattice constant mismatch between silicon and a III-N material, such as GaN, is 17% if grown c-axis on (111) oriented silicon. Also, the thermal expansion difference between the III-N material, such as GaN, is 56%. Both of these factors lead to residual stress and consequently to structural defects and mechanical damage (e.g. cracks) in the structure.

A buffer layer between the silicon substrate and the III-N layer that could absorb stress would help solve the problem. Several copending patent applications have been filed in the U.S. in which rare earth oxides were grown on a silicon substrate to serve as a stress engineered buffer layer for the subsequent growth of III-N semiconductor material. Two of these copending U.S. patent applications are: Strain Compensated REO Buffer for III-N on Silicon, filed 21 Oct. 2011, bearing Ser. No. 13/278,952; and Nucleation of III-N on REO Templates, filed 20 Mar. 2012, bearing Ser. No. 61/613,289, both of which are included herein by reference.

While the rare earth oxide (REO) stress engineered buffer layers can reduce stress to a manageable level the stress can be conveniently reduced or substantially eliminated by including a layer of amorphous silicon oxide between the silicon substrate and the rare earth oxide buffer. Silicon oxide is amorphous material and has low viscosity at temperatures above 500° C. that results in stress relaxation, critical from the point of view of thermal stress during cooling down of GaN (III-N material) on silicon heterostructures. A major problem is that the formation of the amorphous silicon oxide layer must take place during the growth of the single-crystal REO buffer because growth of the REO on an amorphous silicon layer would lead to a polycrystalline REO buffer which is not suitable for single-crystal III-N growth.

There are potentially several ways to form the silicon oxide interface layer all of which have severe drawbacks. In a first method, an atmosphere of excess oxygen can be provided during the REO growth. Some problems with this method are that high oxygen pressure is needed during the process which causes the lifetime of the MBE components in the chamber to deteriorate and the $SiO_x$ layer is not thick enough to adequately perform the stress relief. In a second method, a REO layer is grown on a silicon substrate and the structure is subsequently annealed in oxygen atmosphere. A method of this type is described in U.S. Pat. No. 7,785,706, entitled "Semiconductor Wafer and Process for its Production", issued Aug. 31, 2010 and U.S. Pub. 2010/0221869 of the same title. One problem with this type of method is that the silicon dioxide forms only at the interface and this formation can be hard to control, the oxidation needs long time, temperature and/or high oxygen pressure because oxidation of silicon is a diffusion limited process, which means that oxidation becomes slower with increasing of thickness of the silicon dioxide layer. The oxidation of the silicon substrate starts at the outer edges of the interface and diffuses inwardly as well as further into the silicon substrate so that it is nearly impossible to produce an amorphous silicon layer with a uniform thickness.

It would be highly advantageous, therefore, to remedy the foregoing and other deficiencies inherent in the prior art.

Accordingly, it is an object of the present invention to provide new and improved methods of forming a layer of amorphous silicon between a single crystal REO insulator/stress management layer and a single crystal REO buffer layer on a silicon substrate.

It is another object of the present invention to provide new and improved methods of forming a layer of amorphous silicon dioxide between single crystal REO layers on a silicon substrate that is sufficiently thick to adequately perform stress mitigation.

It is another object of the present invention to provide a new and improved III-N semiconductor layer on a silicon substrate including a layer of amorphous silicon between single crystal REO layers on the substrate.

SUMMARY OF THE INVENTION

Briefly, the desired objects and aspects of the instant invention are achieved in accordance with a preferred method of forming a REO dielectric layer and a layer of amorphous silicon oxide between a layer of III-N material and a silicon substrate. The method includes providing a crystalline silicon substrate and depositing a first layer of single crystal rare earth oxide on the silicon substrate. The first layer of single crystal rare earth oxide has a first lattice constant adjacent the silicon substrate approximately matching the lattice constant of the silicon substrate and the lattice constant of the first layer of rare earth oxide is adjusted to approximately match a lattice constant of a selected III-N material adjacent an upper surface. A uniform layer of amorphous silicon is deposited on the first layer of rare earth oxide. A second layer of rare earth oxide is deposited on the layer of amorphous silicon. The step of depositing the second layer of rare earth oxide includes ramping the temperature of the substrate to a temperature required for epitaxial growth and epitaxially growing the second layer of rare earth oxide. The temperature required for epitaxial growth crystallizes the layer of amorphous silicon to form a layer of crystallized silicon and the crystallized silicon transfers the lattice constant of the selected III-N material of the first layer of rare earth oxide to the second layer of rare earth oxide. The crystalline silicon is oxidized to transform the crystalline silicon to amorphous silicon. A layer of III-N material is epitaxially grown on the second layer of rare earth oxide either after or during the oxidizing of the amorphous silicon.

The desired objects and aspects of the instant invention are further realized in accordance with a preferred embodiment of a REO dielectric layer and a layer of amorphous silicon oxide between a layer of rare earth oxide and a silicon substrate. The structure includes a crystalline silicon substrate with a first layer of single crystal rare earth oxide deposited on the silicon substrate. The first layer of single crystal rare earth oxide has a first lattice constant approximately that of the silicon substrate adjacent the silicon substrate and a second lattice constant approximately that of a selected III-N material adjacent an upper surface. A uniform layer of amorphous silicon is deposited on the first layer of rare earth oxide. A second layer of rare earth oxide is deposited on the layer of amorphous silicon. The second layer of rare earth oxide has the lattice constant of the selected III-N material. A single crystal layer of the selected III-N material is epitaxially deposited on the second layer of rare earth oxide.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIGS. 1-6 are simplified layer diagrams illustrating several sequential steps in a process of the formation of amorphous silicon oxide between layers of single-crystal rare earth oxide for the growth of III-N semiconductor material in accordance with the present invention;

FIGS. 9 and 10 illustrate steps in another method of the formation of amorphous silicon oxide between layers of single-crystal rare earth oxide, in accordance with the present invention.

DETAILED DESCRIPTION OF THE DRAWINGS

Figure 5:
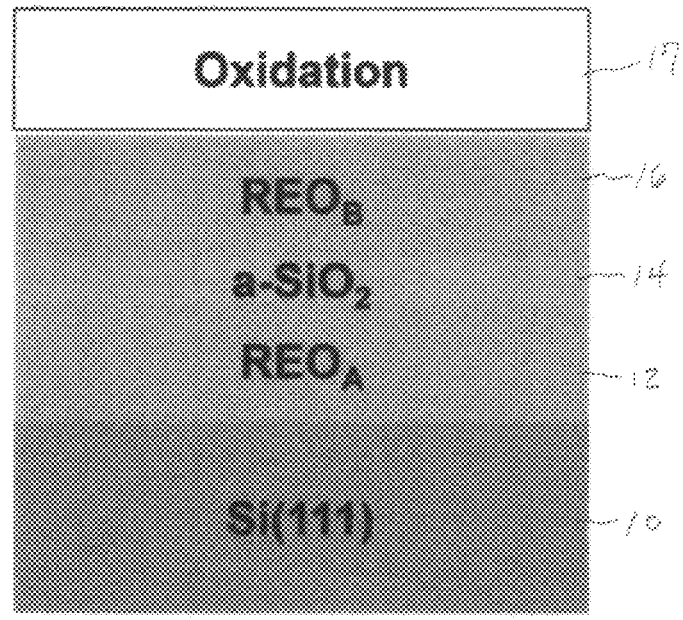

In view of the need for stress mitigation in a process of forming III-N semiconductor layers on silicon substrates some effort and study has gone into the formation of an amorphous layer of silicon oxide ($SiO_2$) between the silicon substrate and the III-N layer or layers. However, to date various proposed methods for the formation of the amorphous layer all have several drawbacks or problems that substantially reduce the efficiency or effectiveness of the process and results. Also, a rare earth dielectric layer between the III-N layer and the silicon substrate improves electric break-down characteristics of electronic devices formed in the III-N layer. Accordingly, a new method for the formation of an amorphous layer of silicon oxide ($SiO_2$) between layers of single crystal rare earth oxide is herein disclosed. The new method is greatly improved and results in the formation of a structure including an amorphous silicon oxide layer between layers of single crystal rare earth oxide that can be accurately controlled and which substantially absorbs or reduces stress between the silicon substrate and the III-N semiconductor layer.

Turning now to FIG. 1, a silicon substrate 10 is illustrated which is, as understood in the art, a single-crystal material including silicon and may in some applications include other materials all of which are included in the general term "silicon" substrate. Also, the substrate may be for example a silicon wafer or some part thereof and is referred to herein by the general term "substrate". While silicon substrate 10 is illustrated as having a (111) crystal orientation, it will be understood, is not limited to any specific crystal orientation but could include (111) silicon, (110) silicon, (100) silicon, various off cuts or offsets of these, or any other orientation or variation known and used in the art.

An insulator layer 12 of single crystal rare earth oxide (REO) is epitaxially deposited on the surface of silicon substrate 10. Rare earth oxide layer 12 is grown directly on the surface of substrate 10 using any of the well-known growth methods, such as MBE, MOCVD, PLD (pulsed laser deposition), sputtering, ALD (atomic layer deposition), or any other known growth method for thin films. Throughout this disclosure whenever rare earth materials are mentioned it will be understood that "rare earth" materials are generally defined as any of the lanthanides as well as scandium and yttrium. While layer 12 is referred to herein as a "layer" for convenience of understanding, it should be understood that it can be a single layer with crystal lattice constant grading from the lower interface with substrate 10, designated $a_{i1}$, to the upper surface or interface, designated $a_{i2}$, as illustrated in FIG. 1. Layer 12 could alternatively include multiple REO layers with gradually changing crystal lattice constant $a_1 > a_2 > \ldots > a_n$, as illustrated in FIG. 2. For purposes of this disclosure the term "layer" is defined to include either single or multiple layers or sub-layers.

In this example, layer 12 not only serves as a rare earth dielectric layer between the III-N layer and silicon substrate 10, to improve electric break-down characteristics of electronic devices formed in the III-N layer, but also acts as a buffer to adjust the lattice constant between silicon substrate 10 and the III-N layer. Thus, in this example, the lattice constant $a_{i1}$ at the substrate interface is selected to be approximately the lattice constant of single crystal silicon while the lattice constant $a_{i2}$ or $a_n$ is adjusted to be approximately the lattice constant of III-V semiconductor material which will be grown on top of the structure.

Turning to FIG. 3, a smooth layer 14 of amorphous silicon is deposited on the surface of REO layer 12 at a temperature close to room temperature, or approximately 20° C. to approximately 100° C. In this specific embodiment, the term "smooth" is defined to mean that the layer has a substantially uniform thickness throughout. The thickness of layer 14 is preferably between 1 nm and 10 nm. In this example low temperature deposition of amorphous silicon is used in order to keep amorphous Si layer 14 smooth because Si surface energy is higher than that of REO and therefore the Si forms islands at temperatures typical for epitaxial growth.

Referring to FIG. 4, a second rare earth oxide layer 16 is formed on the surface of amorphous Si layer 14. Growth of second REO layer 16 is started during substrate temperature ramp (i.e. ramping the temperature of the substrate to a temperature required for epitaxial growth) before full crystallization of amorphous Si layer 14 occurs. Second REO layer 16 also serves as a surfactant to suppress mobility of Si atoms and prevent formation of Si islands. Thus, second REO layer 16 aids in retaining Si layer 14 smooth. During the REO deposition forming REO layer 16, Si layer 14 fully crystallizes and transfers crystal structure register of REO layer 12 to REO layer 16, which grows epitaxially thereafter. In the preferred embodiment, REO layer 16 is approximately 10 nm or less.

Once REO layer 16 is completed the crystal structure is fixed and the lattice constant $a_{i2}$ or $a_n$ is approximately the lattice constant of III-V semiconductor material which will be grown on top of the structure. Referring now to FIG. 5, the next step in this process is to perform oxidation of the structure, designated 17. Oxidation is performed in this process in an oxygen atmosphere at a temperature above the epitaxial growth temperature of REO layer 16 in order to oxidize crystalline Si layer 14. The oxidation transforms crystalline Si interlayer 14 to an amorphous $SiO_2$ layer. Because crystalline Si layer 14 has a definite thickness (i.e. is not simply an interface) and is positioned between and restricted by REO layers 12 and 16 oxidation can occur rapidly through the entire layer. Further, since crystalline Si layer 14 is a smooth layer with a substantially uniform thickness the final layer of amorphous silicon is completely controlled and remains uniform.

Figure 6:
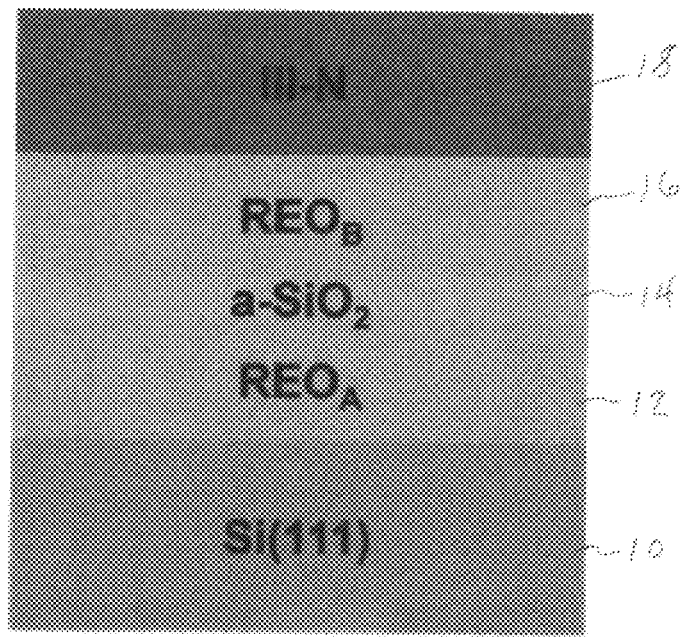

Amorphous $SiO_2$ layer 14 serves as a stress mitigation layer so that REO layer 16 can be increased in thickness if desired. Also, as illustrated in FIG. 6, a layer 18 of III-N material is grown on REO layer 16. Electronic or photonic devices can be formed directly in/on III-N layer 18 or additional layers of III-V semiconductor material can be epitaxially grown on layer 18. It should be understood that because of the crystal constant matching of layer 12, and the stress mitigating of amorphous $SiO_2$ layer 14 all of the layers 12, 16 and 18 are single crystal material and REO layer 12 forms a rare earth dielectric layer between the III-N layer and the silicon substrate to improve electric break-down characteristics of electronic devices formed in/on III-N layer 18.

Figure 7:
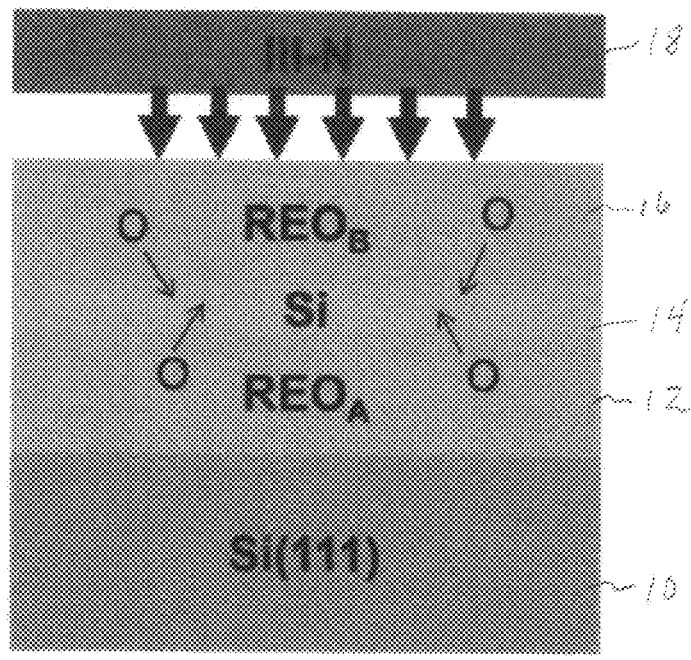
FIGS. 7 and 8 illustrate steps in another method of the formation of amorphous silicon oxide between layers of single-crystal rare earth oxide, in accordance with the present invention.
Figure 8:
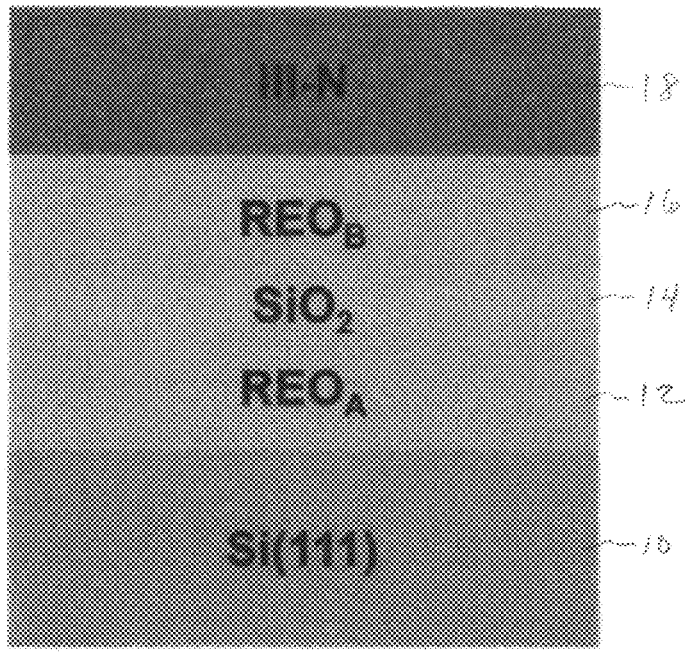

Referring specifically to FIGS. 7 and 8, another method of the formation of amorphous silicon oxide between layers of single-crystal rare earth oxide, in accordance with the present invention, is illustrated. In this process the silicon in layer 14 is crystalline as explained in conjunction with FIG. 4 above. Oxidation of crystalline silicon layer 14 is possible in accordance with this method during growth of III-N semiconductor layer 18 on REO layer 16 because of high substrate temperature (up to 1100° C.) during the III-N growth process (e.g. MOCVD). During growth of III-N semiconductor layer 18 on REO layer 16, because of the high temperatures used in the process, diffusion of oxygen into Si layer 14 (from REO material above and below Si Layer 14) takes place. As a result of this oxygen diffusion the crystalline Si interlayer transforms into amorphous silicon dioxide. One advantage of this process is that it allows uninterrupted growth of REO layer 16 until the desired thickness is reached.

Referring additionally to FIGS. 9 and 10, one additional feature should be understood. During growth of III-N semiconductor layer 18 on REO layer 16, because of the high processing temperatures, it is possible that part of the amorphous $SiO_2$ layer 14 of the first method or part of the crystalline Si of the second method will transform to a silicate ($RESiO_x$). This is illustrated in FIG. 9 where some of the Si of layer 14 combines with some of the rare earth in layer 12 to form a thin layer 20 of silicate ($RESiO_x$) and some of the Si of layer 14 combines with some of the rare earth in layer 16 to form a thin layer 22 of silicate ($RESiO_x$).

Thus, a first layer of single crystal rare earth oxide is grown on a crystalline silicon substrate to serve as a REO dielectric layer to improve electric break-down characteristics of electronic or photonic device formed in/on a final III-N layer of the structure. The first layer of single crystal rare earth oxide also serves stress management purposes between the silicon substrate and the final III-N layer. A smooth layer of silicon is deposited at low temperature and converted to crystalline silicon during the deposition of a second layer of rare earth material so that the second REO layer is epitaxially deposited and the crystalline structure of the first REO layer is transferred to the second REO layer. The crystalline silicon is then converted to a uniform layer of amorphous silicon through either an oxidation process or the high temperature deposition of a layer of single crystal III-N semiconductor material. The amorphous silicon layer helps to relieve stress between the III-N semiconductor layer and the silicon substrate.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims. Having fully described the invention in such clear and concise terms as to enable those skilled in the art to understand and practice the same, the invention claimed is:

The invention claimed is:

1. A method of forming a REO dielectric layer and a layer of amorphous silicon oxide between a layer of III-N semiconductor material and a silicon substrate, the method comprising the steps of:

providing a crystalline silicon substrate; depositing a first layer of single crystal rare earth oxide on the silicon substrate, the first layer of single crystal rare earth oxide having a first lattice constant adjacent the silicon substrate approximately matching the lattice constant of the silicon substrate, and adjusting the lattice constant of the first layer of rare earth oxide adjacent an upper surface of the first layer of rare earth oxide to approximately a lattice constant of a selected III-N material; depositing a uniform layer of amorphous silicon on the first layer of rare earth oxide; depositing a second layer of rare earth oxide on the layer of amorphous silicon, the step of depositing the second layer of rare earth oxide including ramping the temperature of the substrate to a temperature required for epitaxial growth and epitaxially growing the second layer of rare earth oxide, the temperature required for epitaxial growth crystallizing the layer of amorphous silicon to form a layer of crystallized silicon and the crystallized silicon transferring the adjusted lattice constant of the first layer of rare earth oxide to the second layer of rare earth oxide; and oxidizing the crystalline silicon to transform the crystalline silicon to amorphous silicon oxide.

2. A method as claimed in claim 1 further including a step of epitaxially growing a single crystal layer of the selected III-N material on the second layer of rare earth oxide.

3. A method as claimed in claim 1 wherein the step of oxidizing the crystalline silicon includes epitaxially growing a single crystal layer of the selected III-N material on the second layer of rare earth oxide.

4. A method as claimed in claim 3 wherein the step of epitaxially growing the single crystal layer of the selected III-N material includes raising the temperature of the substrate up to 1100° C.

5. A method as claimed in claim 1 wherein the step of oxidizing the crystalline silicon includes raising the temperature of the substrate to a temperature above the temperature required for epitaxial growth and performing the raising in an oxygen atmosphere.

6. A method as claimed in claim 1 wherein the step of depositing the uniform layer of amorphous silicon includes depositing the uniform layer at a temperature in the range of 20° C. to 100° C.

7. A method as claimed in claim 1 wherein the step of depositing the uniform layer of amorphous silicon includes depositing the uniform layer with a thickness in a range of 1 nm to 10 nm.

8. A method of forming a REO dielectric layer and a layer of amorphous silicon oxide between a layer of III-N semiconductor material and a silicon substrate, the method comprising the steps of: providing a crystalline silicon substrate; depositing a first layer of single crystal rare earth oxide on the silicon substrate, the first layer of single crystal rare earth oxide having a first lattice constant adjacent the silicon substrate approximately matching the lattice constant of the silicon substrate, and adjusting the lattice constant of the first layer of rare earth oxide adjacent an upper surface of the first layer of rare earth oxide to approximately a lattice constant of a selected III-N material; depositing a uniform layer of amorphous silicon on the first layer of rare earth oxide; depositing a second layer of rare earth oxide on the layer of amorphous silicon, the step of depositing the second layer of rare earth oxide including ramping the temperature of the substrate to a temperature required for epitaxial growth and epitaxially growing the second layer of rare earth oxide, the temperature required for epitaxial growth crystallizing the layer of amorphous silicon to form a layer of crystallized silicon and the crystallized silicon transferring the adjusted lattice constant of the first layer of rare earth oxide to the second layer of rare earth oxide; and oxidizing the crystalline silicon to transform the crystalline silicon to amorphous silicon oxide including raising the temperature of the substrate to a temperature above the temperature required for epitaxial growth and performing the raising in an oxygen atmosphere; and epitaxially growing a single crystal layer of the selected III-N material on the second layer of rare earth oxide.

9. A method as claimed in claim 8 wherein the step of depositing the uniform layer of amorphous silicon includes depositing the uniform layer at a temperature in the range of 20° C. to 100° C.

10. A method as claimed in claim 8 wherein the step of depositing the uniform layer of amorphous silicon includes depositing the uniform layer with a thickness in a range of 1 nm to 10 nm.

11. A method of forming a REO dielectric layer and a layer of amorphous silicon oxide between a layer of III-N semiconductor material and a silicon substrate, the method comprising the steps of: providing a crystalline silicon substrate; depositing a first layer of single crystal rare earth oxide on the silicon substrate, the first layer of single crystal rare earth oxide having a first lattice constant adjacent the silicon substrate approximately matching the lattice constant of the silicon substrate, and adjusting the lattice constant of the first layer of rare earth oxide adjacent an upper surface of the first layer of rare earth oxide to approximately a lattice constant of a selected III-N material; depositing a uniform layer of amorphous silicon on the first layer of rare earth oxide; depositing a second layer of rare earth oxide on the layer of amorphous silicon, the step of depositing the second layer of rare earth oxide including ramping the temperature of the substrate to a temperature required for epitaxial growth and epitaxially growing the second layer of rare earth oxide, the temperature required for epitaxial growth crystallizing the layer of amorphous silicon to form a layer of crystallized silicon and the crystallized silicon transferring the adjusted lattice constant of the first layer of rare earth oxide to the second layer of rare earth oxide; and oxidizing the crystalline silicon to transform the crystalline silicon to amorphous silicon oxide including epitaxially growing a single crystal layer of the selected III-N material on the second layer of rare earth oxide, the epitaxially growing of the single crystal layer of the selected III-N material including raising the temperature of the substrate to a temperature of 1100° C. or less.

12. A method as claimed in claim 11 wherein the step of depositing the uniform layer of amorphous silicon includes depositing the uniform layer at a temperature in the range of 20° C. to 100° C.

13. A method as claimed in claim 11 wherein the step of depositing the uniform layer of amorphous silicon includes depositing the uniform layer with a thickness in a range of 1 nm to 10 nm.

* * * * *